(12) United States Patent
Del-Agua-Borniquel et al.

(10) Patent No.: US 11,430,898 B2
(45) Date of Patent: Aug. 30, 2022

(54) OXYGEN VACANCY OF AMORPHOUS INDIUM GALLIUM ZINC OXIDE PASSIVATION BY SILICON ION TREATMENT

(71) Applicant: APPLIED MATERIALS, INC., Santa Clara, CA (US)

(72) Inventors: Jose-Ignacio Del-Agua-Borniquel, Bertem (BE); Hendrik F. W. Dekkers, Tienen (BE); Hans Van Meer, Middleton, MA (US); Jae Young Lee, Bedford, MA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 14 days.

(21) Appl. No.: 16/818,963

(22) Filed: Mar. 13, 2020

(65) Prior Publication Data

US 2021/0288186 A1      Sep. 16, 2021

(51) Int. Cl.
| | |
|---|---|
| *H01L 29/786* | (2006.01) |
| *H01L 29/66* | (2006.01) |
| *H01L 21/02* | (2006.01) |
| *H01L 21/425* | (2006.01) |
| *H01L 29/24* | (2006.01) |

(52) U.S. Cl.
CPC .. *H01L 29/78693* (2013.01); *H01L 21/02565* (2013.01); *H01L 21/02592* (2013.01); *H01L 21/02631* (2013.01); *H01L 21/425* (2013.01); *H01L 29/247* (2013.01); *H01L 29/66969* (2013.01); *H01L 29/78696* (2013.01)

(58) Field of Classification Search
CPC ......... H01L 29/78693; H01L 21/02565; H01L 21/02592; H01L 21/02631; H01L 21/425; H01L 29/247; H01L 29/66969; H01L 29/78696; H01L 29/7869; H01L 21/16; H01L 21/00; H01L 29/24; H01L 21/479
USPC .............................. 257/43, E29.296, E21.468
See application file for complete search history.

(56) References Cited

U.S. PATENT DOCUMENTS

| | | |
|---|---|---|
| 7,397,047 B2 | 7/2008 | Chang et al. |
| 8,803,112 B2 | 8/2014 | Sinha et al. |
| 8,846,508 B1 | 9/2014 | England et al. |

(Continued)

OTHER PUBLICATIONS

Nobuyoshi Saito, Kentaro Miura, Tomomasa Ueda, Tsutomu Tezuka, and Keiji Ikeda, High-Mobility and H2-Anneal Tolerant InGaSiO/InGaZnO/InGaSiO Double Hetero Channel Thin Film Transistor for Si—LSI, Compatible Process, Advanced LSI Technology Laboratory, Research and Development Center, Toshiba Corporation, Kawasaki 212-8582, Japan Corresponding Author: N. Saito (e-mail: nobuvoshi.saito@toshiba.co.io), vol. 6 2018, pp. 500-505.

(Continued)

*Primary Examiner* — Bo B Jang
(74) *Attorney, Agent, or Firm* — Moser Taboada

(57) ABSTRACT

Methods and apparatus for forming a thin film transistor (TFT) having a metal oxide layer. The method may include forming an amorphous metal oxide layer and treating the metal oxide layer with a silicon containing gas or plasma including $Si^{4+}$ ions. The silicon treatment of the metal oxide layer helps fill the oxygen vacancies in the metal oxide channel layer, leading to a more stable TFT and preventing a negative threshold voltage in the TFT.

18 Claims, 8 Drawing Sheets

(56) References Cited

U.S. PATENT DOCUMENTS

| 9,460,961 | B2 | 10/2016 | Omstead et al. |
| 9,937,004 | B2 | 4/2018 | Van Hal et al. |
| 10,134,878 | B2 | 11/2018 | Hsu et al. |
| 2006/0169915 | A1 | 8/2006 | Olson et al. |
| 2015/0194317 | A1 | 7/2015 | Manna et al. |
| 2018/0212059 | A1* | 7/2018 | Ning ............... H01L 27/1288 |
| 2019/0288115 | A1* | 9/2019 | Goto ............... H01L 21/425 |

OTHER PUBLICATIONS

Shinya Aikawa et al., Stap Review Si-incorporated amorphous indium oxide thin-film transistors, 2019 Jpn. J. Appl. Phys. 58 090506, 16 pages.

* cited by examiner

OXYGEN VACANCY OF AMORPHOUS INDIUM GALLIUM ZINC OXIDE PASSIVATION BY SILICON ION TREATMENT

FIELD

Embodiments of the present disclosure generally relate to a method of forming a thin film transistor (TFT), and more specifically to methods for forming a TFT having an indium gallium zinc oxide (IGZO) layer.

BACKGROUND

Metal oxide semiconductors, such as indium gallium zinc oxide (IGZO) are attractive for device fabrication due to high carrier mobility, low processing temperatures, and optical transparency. Front-End-of-Line (FEOL) or Back-end-of-line (BEOL) transistors include metal oxide semiconductors including indium gallium zinc oxide (IGZO) and may be useful in e.g., memory applications. The indium gallium zinc oxide (IGZO) material enables BEOL transistors for memory applications with low or zero leakage and relatively high mobility.

However, metal oxide layers, such as metal oxide channel layers including indium gallium zinc oxide (IGZO) are problematically susceptible to post-deposition processing deficiencies where hydrogen contributes to the formation of oxygen vacancies in the layer making the channel problematically conductive. Oxygen vacancies problematically lead to unstable semiconductor devices and are detrimental to the switching voltage of the devices. In addition, the formation of oxygen vacancies also causes negative threshold voltages, since oxygen vacancies are donors in metal oxide materials.

Therefore, the inventors believe that there is a need in the art for forming stable metal oxide materials such as indium gallium zinc oxide (IGZO) materials for use as a channel oxide layer.

SUMMARY

Methods and apparatus for passivating oxygen vacancy formation within amorphous indium gallium zinc oxide are provided herein. In some embodiments, a method for passivating oxygen vacancy formation within amorphous indium gallium zinc oxide, includes: depositing an amorphous indium gallium zinc oxide layer atop a gate dielectric layer; and contacting the amorphous indium gallium zinc oxide layer with silicon ions under conditions sufficient to reduce or eliminate the formation of oxygen vacancies.

In some embodiments, the present disclosure provides a method of passivating oxygen vacancy formation within amorphous indium gallium zinc oxide, including: forming a gate electrode atop a substrate; depositing a gate dielectric layer atop the gate electrode; depositing an amorphous indium gallium zinc oxide layer atop the gate dielectric layer; contacting the amorphous indium gallium zinc oxide layer with silicon ions; and depositing a conductive layer atop the amorphous indium gallium zinc oxide layer.

In some embodiments, the present disclosure relates to a thin film transistor including: an amorphous indium gallium zinc oxide layer atop a gate dielectric layer, wherein the amorphous indium gallium zinc oxide layer has a top portion, and bottom portion, wherein silicon ions are implanted within the top portion.

In some embodiments, a method for passivating oxygen vacancy formation within amorphous indium gallium zinc oxide, includes contacting an amorphous indium gallium zinc oxide layer with silicon ions under conditions sufficient to passivate the formation of a plurality of oxygen vacancies.

In some embodiments, the present disclosure relates to a non-transitory computer readable medium having instructions stored thereon that, when executed, cause a method for passivating oxygen vacancy formation within amorphous indium gallium zinc oxide, including: depositing an amorphous indium gallium zinc oxide layer atop a gate dielectric layer; and contacting the amorphous indium gallium zinc oxide layer with silicon ions under conditions sufficient to reduce or eliminate the formation of oxygen vacancies.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, wherever possible, to designate identical elements common to the Figures. Additionally, elements of one embodiment may be advantageously adapted for utilization in other embodiments described herein.

DETAILED DESCRIPTION

Embodiments of the present disclosure generally relate to methods for forming a TFT having a metal oxide layer including indium gallium zinc oxide (IGZO). In some embodiments, a method for passivating oxygen vacancy formation within amorphous indium gallium zinc oxide, includes contacting an amorphous indium gallium zinc oxide layer with silicon ions under conditions sufficient to reduce or eliminate the formation of oxygen vacancies. In some embodiments, the methods may include forming a metal oxide layer and treating the metal oxide layer with silicon ion containing gas or plasma. The silicon ion treatment of the metal oxide layer reduces or eliminates the formation of oxygen vacancies in the metal oxide channel layer, leading to a more stable TFT and preventing a negative threshold voltage in the TFT. In embodiments, methods of the present disclosure create more robust metal oxide layers, less susceptible to hydrogen reactivity which detrimentally removes oxygen from the metal oxide layers and forms oxygen vacancies, including IGZO with excellent threshold voltage (Vth) control. In embodiments, the methods reduce or eliminate the inclusion of oxygen annealing processes or including one or more capping layers atop the metal oxide layer including indium gallium zinc oxide (IGZO). In embodiments, methods of the present disclosure reduce or remove thermal budget constraints enabling metallization or integration schemes.

Figure 1:
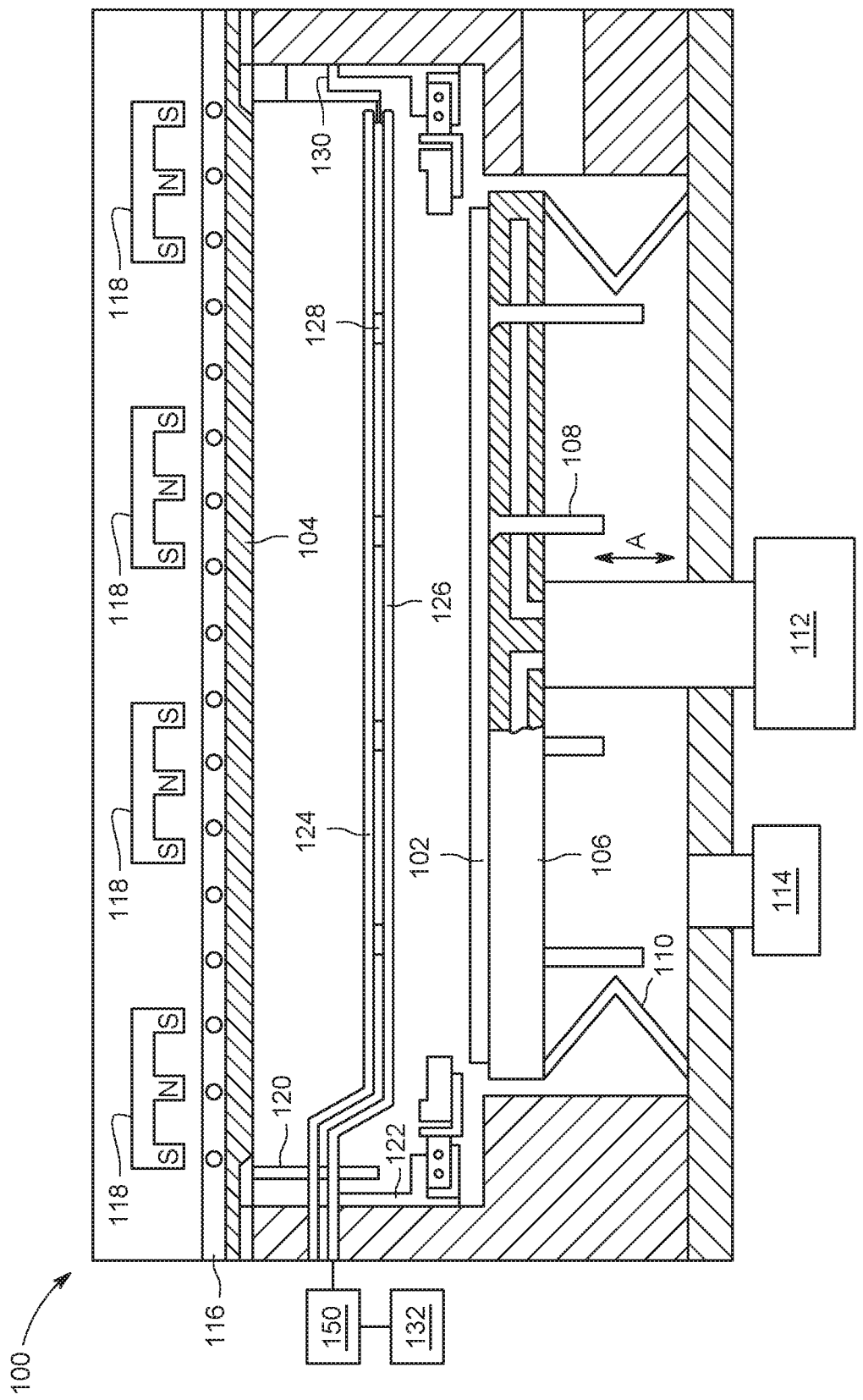
FIG. 1 is a cross sectional schematic view of a physical vapor deposition chamber according to embodiments disclosed herein.

FIG. 1 is a cross sectional schematic view of a physical vapor deposition (PVD) chamber 100 according to embodiments disclosed herein. The PVD chamber 100 may be evacuated by a vacuum pump 114. Within the PVD chamber 100, a substrate 102 may be disposed opposite a target 104. The substrate 102 may be disposed on a susceptor 106 within the PVD chamber 100. The susceptor 106 may be elevated and lowered as shown by arrows "A" by an actuator 112. The susceptor 106 may be elevated to raise the substrate 102 to a processing position and lowered so the substrate 102 may be removed from the PVD chamber 100. Lift pins 108 elevate the substrate 102 above the susceptor 106 when the susceptor 106 is in the lowered position. Grounding straps 110 may ground the susceptor 106 during processing. The susceptor 106 may be raised during processing to aid in uniform deposition.

In some embodiments, the target 104 may include one or more targets. In one embodiment, the target 104 may be a large area sputtering target. In another embodiment, the target 104 may be a plurality of tiles. In yet another embodiment, the target 104 may be a plurality of target strips. In still another embodiment, the target 104 may be one or more cylindrical, rotary targets. The target 104 may be bonded to a backing plate 116 by a bonding layer (not shown). One or more magnetrons 118 may be disposed over the backing plate 116. The magnetrons 118 may scan across the backing plate 116 in a linear movement or in a two-dimensional path. The walls of the chamber may be shielded from deposition by a dark space shield 120 and a chamber shield 122.

In some embodiments, uniform sputtering deposition across a substrate 102 is obtained by including an anode 124 between the target 104 and the substrate 102. In one embodiment, the anode 124 may be bead blasted stainless steel coated with arc sprayed aluminum. In one embodiment, one end of the anode 124 may be mounted to the chamber wall by a bracket 130. The anode 124 provides a charge in opposition to the target 104 so charged ions will be attracted thereto rather than to the chamber walls which are typically at ground potential. By providing the anode 124 between the target 104 and the substrate 102, the plasma may be more uniform, which may aid the deposition. To reduce flaking, a cooling fluid may be provided through the one or more anodes 124. By reducing the amount of expansion and contraction of the anodes 124, flaking of material from the anodes 124 may be reduced. For smaller substrates and hence, smaller processing chambers, the anodes 124 spanning the processing space may not be necessary as the chamber walls may be sufficient to provide a path to ground and a uniform plasma distribution.

In some reactive sputtering embodiments, a reactive gas is provided into the PVD chamber 100. One or more gas introduction tubes 126 may also span the distance across the PVD chamber 100 between the target 104 and the substrate 102. For smaller substrates and smaller chambers, the gas introduction tubes 126 spanning the processing space may not be necessary as an even gas distribution may be possible through conventional gas introduction means. The gas introduction tubes 126 may introduce sputtering gases from a gas panel 132. In some embodiments, a remote plasma source 150 may be coupled between the gas panel 132 and the gas introduction tubes 126, and the gas introduction tubes 126 may be used to introduce a remote plasma produced by the remote plasma source 150 into the PVD chamber 100. The gas introduction tubes 126 may be coupled with the anodes 124 by one or more couplings 128. The coupling 128 may be made of thermally conductive material to permit the gas introduction tubes 126 to be conductively cooled. Additionally, the coupling 128 may be electrically conductive as well so the gas introduction tubes 126 are grounded and function as anodes.

In some embodiments, a reactive sputtering process may include disposing a indium gallium zinc oxide (IGZO) sputtering target opposite a substrate in the PVD chamber 100. The IGZO sputtering target may substantially include indium gallium zinc oxide at a ratio of about 1:1:1. In some embodiments, the indium gallium zinc oxide (IGZO) sputtering target may include a doping element. Non-limiting examples of suitable dopants include aluminum (Al), tin (Sn), titanium (Ti), copper (Cu), or magnesium Mg, or combinations thereof. In one embodiment, the dopant includes aluminum. In some embodiments, substrate 102 may comprise plastic, paper, polymer, glass, stainless steel, and combinations thereof. In some embodiments, wherein the substrate is plastic, the reactive sputtering may occur at temperatures below about 250 to 300 degrees Celsius, such as 300 degrees Celsius or about 300 degrees Celsius.

In some embodiments, during a sputtering process, argon may be provided to the chamber for reactive sputtering the target, such as an IGZO target. Additional additives such as $B_2H_6$, $CO_2$, CO, $CH_4$, and combinations thereof may also be provided to the chamber during the sputtering. In one embodiment, a nitrogen containing gas may be included including nitrogen ($N_2$). In another embodiment, a nitrogen containing gas may include $N_2O$, $NH_3$, or combinations thereof. In one embodiment, the oxygen may be included such as $O_2$. In another embodiment, an oxygen containing gas comprises $N_2O$. The nitrogen of the nitrogen containing gas and the oxygen of the oxygen containing gas react with the atoms from the sputtering target to form a metal oxide layer including zinc, oxygen, and nitrogen on the substrate. In one embodiment, the metal oxide layer is an amorphous IGZO layer. In some embodiments, the metal oxide layer is an amorphous IGZO layer with preselected electrical properties and suitable for use in an integrated device.

In some embodiments, sputtering is performed for a duration and under conditions sufficient to form an amorphous indium gallium zinc oxide layer having a thickness of between about 5 to about 100 nanometers, 5 to 75 nanometers, or 10 to about 30 nanometers. In some embodiments, an amorphous indium gallium zinc oxide layer is formed having a top surface and a bottom surface, a depth between the top surface and the bottom surface including a thickness of between about 10 to about 30 nanometers. In some embodiments, the amorphous indium gallium zinc oxide layer is formed atop a substrate such as a substrate including a gate dielectric layer at a temperature of 250 degrees Celsius to 350 degrees Celsius under sputter gas comprising or consisting of argon. In embodiments, about 15 to 30 nanometers of amorphous IGZO is deposited at about 300 degrees Celsius in up to 100% argon environment in the deposition chamber. In embodiments, argon is suitable as a sputtering gas and provided in amounts sufficient to promote the formation of amorphous IGZO.

Figure 2:
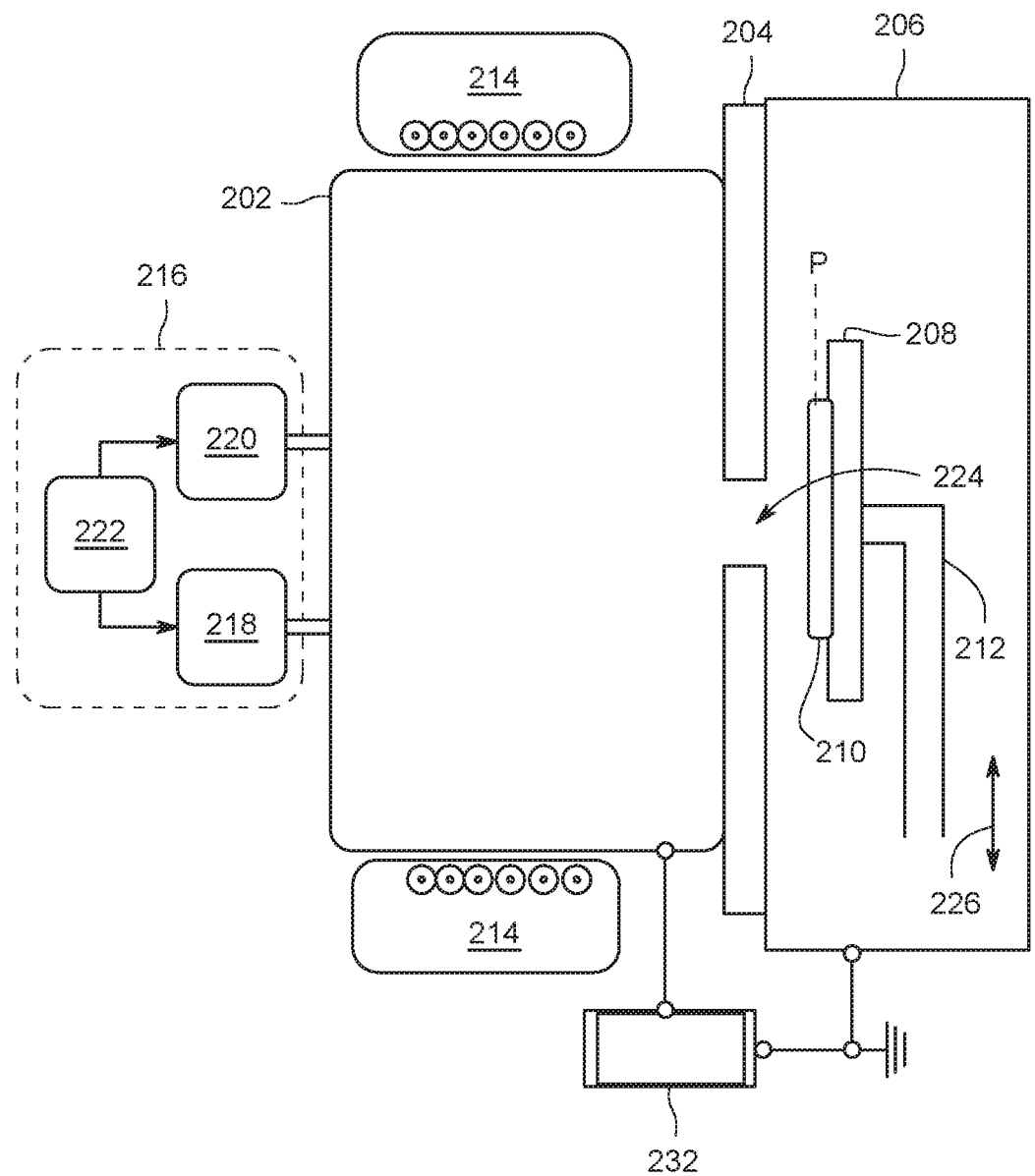
FIG. 2 is a cross sectional schematic view of an implantation chamber according to embodiments disclosed herein.

FIG. 2 is a cross sectional schematic view of an implantation chamber 200 according to embodiments of the present disclosure. In some embodiments, implantation chamber 200 is configured for performing a silicon ion implantation process by beamline or plasma implantation tools. In some embodiments, suitable silicon ions for implantation are characterized as silicon(4+), silicon(IV) cation, or Si+4. Exemplary systems utilized to perform the implantation process include, for example, the VARIAN VIISTA TRIDENT system, VIISTA 3000XP system, VIISTA 900XP system, VIISTA HOP system and the VISTA PLAD system, all available from Applied Materials, Inc., Santa Clara, Ca. Although described with regard to the systems mentioned above, systems from other manufacturers may also be utilized to perform the ion implantation process.

In some embodiments, implantation chamber 200 includes a plasma chamber 202 and an extraction plate 204 disposed along a side of the plasma chamber 202. The extraction plate 204 is disposed between the plasma chamber 202 and a process chamber 206, which is configured to house a substrate holder 208 and substrate 210. As shown in FIG. 2 the substrate holder may be movable with the aid of a stage 212 along the X-axis, Y-axis, or Z-axis. In various embodiments, the substrate holder 208 may be configured to rotate within the X-Y plane or tilt with respect to the X-Y plane.

In some embodiments, the implantation chamber 200 also includes a plasma source 214, which may be used to generate a plasma in the plasma chamber 202. For example, the plasma source 214 may, in some embodiments, be an in situ source or remote source, an inductively coupled plasma source, capacitively coupled plasma source, helicon source, microwave source, arc source, or any other type of plasma source.

In some embodiments, the implantation chamber 200 includes a gas source assembly 216 including a gas source 218, which may supply to the plasma chamber 202 gas such as oxygen ($O_2$), hydrogen ($H_2$), or nitrogen ($N_2$) gas. In some embodiments, the gas supplied from gas source 218 may be used to generate reactive ions such as $Si^{4+}$ in the plasma chamber 202 to be extracted through an extraction aperture 224 and implanted into the substrate 210 to form an altered layer such as an amorphous IGZO layer comprising silicon ions (e.g. $Si^{4+}$). For example, an extraction voltage may be applied by an extraction voltage supply 232 between the plasma chamber 202 and process chamber 206 to implant silicon ions into an amorphous IGZO layer disposed upon the substrate 210. In some embodiments, the implantation chamber 200 is configured to implant an amorphous IGZO layer with a plurality of silicon ions such as $Si^{4+}$.

In some embodiments, the gas source assembly 216 may also include a gas source 220, which supplies a molecular gas may be used to react with an altered layer in the substrate 210 to form a volatile product. The gas source assembly 216 may include a controller 222 is coupled to the gas source 218 and gas source 220 and is configured to control the providing of gaseous species to the plasma chamber 202. In embodiments, the molecular gas is preselected to provide silicon or Si ions such as silicon ion dopant species including silicon or silicon containing positive ions such as $Si^{4+}$ suitable for implantation into an amorphous indium gallium zinc oxide (IGZO) layer. In some embodiments, silicon ion species are individual species from silicon tetrafluoride ($SiF_4$) and/or disilane ($Si_2H_6$) in a silicon-based dopant gas composition introduced from gas source assembly 216 into the plasma chamber 202. In embodiments, silicon tetrafluoride ($SiF_4$) and/or disilane ($Si_2H_6$) are provided alone or as a mixture to under conditions suitable for providing silicon ions such as $Si^{4+}$ to the amorphous indium gallium zinc oxide (IGZO) layer. In some embodiments, the gas source assembly is configured to provide silicon ions in an amount sufficient to implant an amorphous IGZO layer with a plurality of silicon ions.

In some embodiments, during operation of the implantation chamber 200, a plasma is generated in the plasma chamber 202. The plasma may be generated when reactive gas is provided from gas source 218. In some embodiments, the plasma may include silicon ions. However, the embodiments are not limited in the described context. In some embodiments, the extraction voltage supply 232 may apply an extraction voltage as a positive voltage to the plasma chamber with respect to the process chamber 206 and also the substrate holder 208 to attract positive ions from the plasma to the substrate 210. In some embodiments, an ion beam is directed through the extraction aperture 224 and impinges upon the substrate 210. The extraction voltage applied by the extraction voltage supply 232 may be sufficient to cause implantation of ions of the ion beam into the substrate 210 and in particular into an amorphous indium gallium zinc oxide (IGZO) layer provided on the substrate 210. In embodiments, however, the ion beam may generate an altered layer within an amorphous indium gallium zinc oxide (IGZO) layer disposed on the substrate 210, where the altered layer is composed of an amorphous indium gallium zinc oxide (IGZO) layer material including silicon ions. In embodiments, the altered layer is more robust such that oxygen therein will not react with hydrogen and leave the material forming one or more oxygen vacancies. In some embodiments, the silicon ions are deposited to a predetermined depth within the amorphous indium gallium zinc oxide (IGZO) layer material such as for example, up to 1 nanometer, or in some embodiments, up to 5 nanometers.

In some embodiments, the substrate holder 208 may be scannable along a direction 226 lies parallel to the Y-axis. In embodiments, the extraction aperture 224 may be an elongated slot having a short dimension, or aperture width, along the Y-axis which is less than the dimension of the substrate 210. In some embodiments, the long dimension of the extraction aperture 224 is parallel to the X-axis and may be equal to or exceed the dimension of the substrate 210 along the X-axis. Accordingly, when the substrate holder 208 is scanned a sufficient distance along direction 226, the entirety of substrate 210 may be exposed to the ion beam.

In some embodiments, the implantation chamber 200 includes no plasma in the plasma chamber 202. However, the gas source 220 may supply molecular gas to the plasma chamber 202, which may include undissociated, as well as non-ionized, molecules. The molecular gas may stream out of the plasma chamber 202 via the extraction aperture 224 as a molecular beam, which impacts the substrate 210. Thus, the plasma chamber 202 may act as a source of ions and as a molecular source. However, in other embodiments, a plasma chamber and molecular source may be separate chambers.

In some embodiments, molecular species within the molecular beam such as $Si^{4+}$ are configured to implant a first distance into an amorphous indium gallium zinc oxide (IGZO) layer on the substrate 210, creating mixture of amorphous material resulting in removal of reactive material or IGZO material including oxygen vacancies. In some embodiments the implantation penetrates $Si^{4+}$ only about half, up to 40%, up to 30%, up to 25%, up to 20%, or about up to 15% of the altered amorphous IGZO material. In some embodiments the implantation penetrates $Si^{4+}$ about 1 to 30 percent of the altered amorphous IGZO material. In some embodiments, the implantation penetrates up to 33% of the altered amorphous IGZO material measured from the side of initial implantation into the IGZO material. In some embodiments, the implantation penetrates silicon ions up to 50% of the altered amorphous IGZO material measured from the side of initial implantation into the IGZO material.

In some embodiments, the silicon ion implantation process implants a silicon dopant into the amorphous indium gallium zinc oxide (IGZO) layer. In some embodiments, the implant energy utilized to energize the dopant is between about 0.5 key and about 10 key, depending on the type of dopant utilized, the thickness of the amorphous indium gallium zinc oxide (IGZO) layer and the depth of implantation desired. In embodiments, the ion dosage (ions/cm$^2$) is between about $5 \times 10^{15}$ and about $1 \times 10^{16}$ such as $8 \times 10^{15}$. For example, when the silicon ion implantation process is performed after the amorphous indium gallium zinc oxide has been deposited and silicon ions are implanted with a low or mid energy, such as between about 0.5 keV and about 1 keV and a dose, such as greater than about $7 \times 10^{15}$ ions/cm$^2$. In embodiments, the temperature at with which the silicon ions are directed towards the amorphous indium gallium zinc oxide layer may be about 19-25 degrees Celsius, 20-325 degrees Celsius, or 20-200 degrees Celsius.

In some embodiments, silicon ions contact the amorphous indium gallium zinc oxide layer under conditions sufficient to reduce or eliminate residual hydrogen from reacting with oxygen within the amorphous indium gallium zinc oxide layer material, and/or reduce or eliminate the formation of oxygen vacancies. In embodiments, a substantial amount of oxygen vacancies are reduced or eliminated such as up to 95%, 96%, 97%, 98%, 99% or 95% to 99.99% such as when compared to similar amorphous indium gallium zinc oxide layer material that has not been treated in accordance with the present disclosure. In some embodiments, zero oxygen vacancies are formed after the contact with silicon ions in accordance with the present disclosure.

In some embodiment, the ion implantation process is performed on a portion less than the entire thickness of the amorphous indium gallium zinc oxide layer. In embodiments, the process may be repeated as many times as needed until a desired depth of amorphous indium gallium zinc oxide is doped with implanted silicon ions throughout the entire length of the amorphous indium gallium zinc oxide layer. In some embodiments, an amorphous indium gallium zinc oxide layer having a thickness of between about 10 to about 30 nanometers, has a top surface 311 and a bottom surface 313, and thickness (shown as arrow 341) of between about 10 to about 25 nanometers. In some embodiments, silicon ions are implanted adjacent the top surface to a depth of e.g., about 1 to 5 nanometers, or up to 5 nanometers. In some embodiments, an amorphous indium gallium zinc oxide layer 310 is a treated amorphous indium gallium zinc oxide layer atop a gate dielectric layer, wherein the amorphous indium gallium zinc oxide layer has a top portion (as shown by arrow 350), middle portion (as shown by arrow 351), and bottom portion (as shown by arrow 352), wherein silicon ions are implanted within the top portion (as shown by arrow 350) as shown and described in FIG. 3C below. In some embodiments, an amorphous indium gallium zinc oxide layer 310 is a treated amorphous indium gallium zinc oxide layer atop a gate dielectric layer, wherein the amorphous indium gallium zinc oxide layer has a top portion (as shown by arrow 350), and bottom portion (as shown by arrow 352), wherein silicon ions are implanted within the top portion (as shown by arrow 350). In some embodiments, the middle portion is optional.

In some embodiment, subsequent to the silicon ion implantation process, the treated amorphous indium gallium zinc oxide layer is subjected to additional downstream processing. For example, suitable post-ion implant thermal treatment techniques may include UV treatment, thermal annealing, and laser annealing. The thermal treatment of the amorphous indium gallium zinc oxide incorporates the implanted ions into the framework of the amorphous indium gallium zinc oxide layer. For example, the implanted ions may be redistributed within the amorphous indium gallium zinc oxide layer to forma more uniform doping profile.

Referring now to FIGS. 3A-3G, cross sectional schematic views of a TFT 300 are shown at various stages of fabrication according to embodiments of the present disclosure. In embodiments, TFT 300 may include a substrate 302. In one embodiment, the substrate 302 may be glass, polymer, plastic, metal or combinations thereof. In still another embodiment, the substrate 302 may be a stainless steel sheet.

In some embodiments, a gate electrode 304 may be formed atop substrate 302. In some embodiments, a thermal oxide layer may be between the gate electrode 304 and the substrate 302, however other integration schemes may use other materials different than a thermal oxide. In embodiments, the gate electrode 304 may be an electrically conductive layer which controls the movement of charge carriers within the TFT 300. The gate electrode 304 may be made of a metal such as aluminum, molybdenum, tungsten, chromium, tantalum, or combinations thereof. The gate electrode 304 may be formed using conventional deposition techniques including sputtering, lithography, and etching. The gate electrode 304 may be formed by blanket depositing a conductive layer over the substrate 302. The conductive layer may be deposited by sputtering. Thereafter, in some embodiments, a photoresist layer may be deposited over the conductive layer. The photoresist layer may be patterned to form a mask. The gate electrode 304 may be formed by etching away the unmasked portions of the conductive layer to leave the gate electrode 304 over the substrate 302.

Figure 3A:
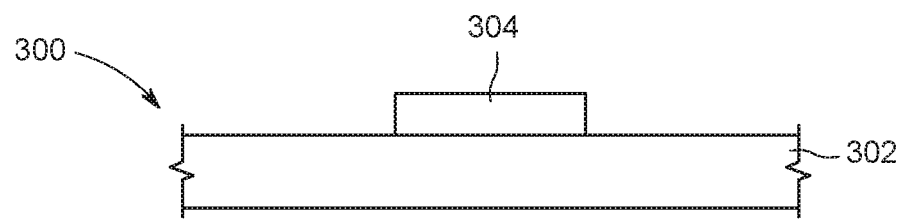
FIGS. 3A-3G are cross sectional schematic views of a TFT at various stages of fabrication according to embodiments of the present disclosure.
Figure 3B:
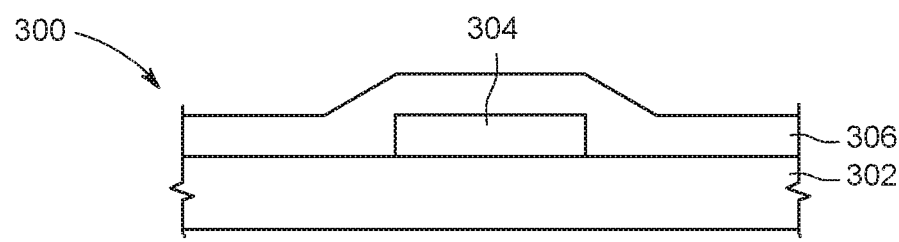

In some embodiments, a gate dielectric layer 306 may be deposited over the gate electrode 304 as shown in FIG. 3B. The gate dielectric layer 306 may be deposited directly on the gate electrode 304. The gate dielectric layer 306 affects the sub threshold swing or slope and the threshold voltage (Vth) of the TFT 300. For silicon based TFTs (e.g., TFTs having a silicon based semiconductor layer such as amorphous silicon), the gate dielectric layer 306 may not include silicon oxide because Vth is far away from zero volts of the gate voltage which causes the TFT to perform poorly. However, for metal oxide TFTs, silicon oxide may function as an effective gate dielectric layer 306. The oxygen in the silicon oxide may not detrimentally alter the metal oxide layer and thus, the TFT may not fail. In one embodiment, the gate dielectric layer 306 may include $Al_2O_3$. The gate dielectric layer 306 may be deposited by well-known deposition techniques including PECVD. In one embodiment, the gate dielectric layer 306 may be deposited by PVD.

Figure 3C:
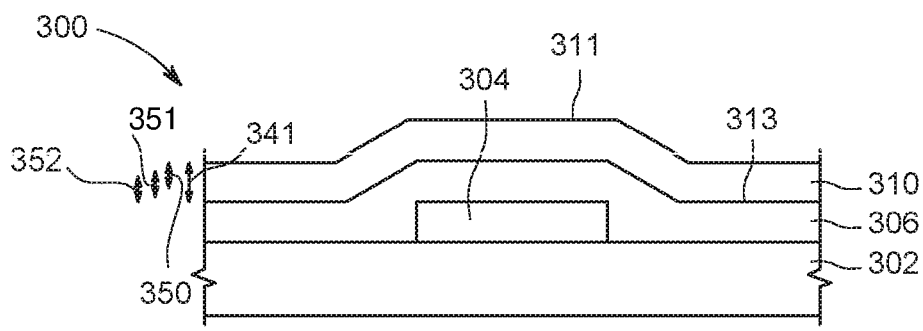
Figure 3D:
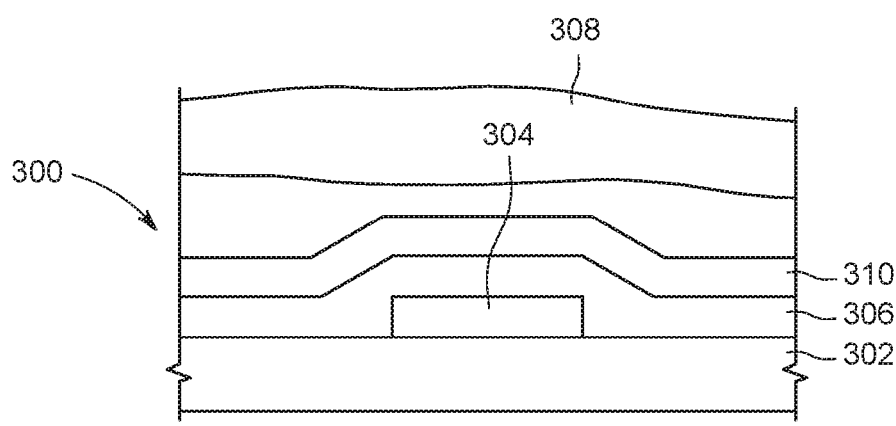

Referring now to FIG. 3C, amorphous indium gallium zinc oxide (IGZO) layer 310 may be deposited on and in direct contact with the gate dielectric layer 306. In embodiments, the amorphous indium gallium zinc oxide (IGZO) layer 310 may be the active channel in the final TFT structure. In one embodiment, the amorphous indium gallium zinc oxide (IGZO) layer 310 may be deposited by sputtering using the PVD chamber 100 shown in FIG. 1 under the conditions described above.

In some embodiments, after the amorphous indium gallium zinc oxide (IGZO) layer 310 is deposited, an implantation process may be performed on the amorphous indium gallium zinc oxide (IGZO) layer 310. In embodiments, the implantation process may be performed in implantation chamber 200 shown above. In some embodiments, to prevent oxygen from leaving the amorphous indium gallium zinc oxide (IGZO) layer 310, the amorphous indium gallium zinc oxide (IGZO) layer 310 may be treated by a silicon ion containing gas or plasma. In some embodiments, the ion implantation process implants one or more or a plurality of silicon ion into the amorphous indium gallium zinc oxide (IGZO) layer. In some embodiments, the implant energy utilized to energize the dopant is between about 0.5 keV and about 10 key, depending on the type of dopant utilized, the thickness of the amorphous indium gallium zinc oxide (IGZO) layer and the depth of implantation desired. In embodiments, the ion dosage (ions/cm$^2$) is between about $5\times10^{15}$ and about $1\times10^{18}$ such as $8\times10^{15}$.

In some embodiments, the treatment process of the amorphous indium gallium zinc oxide (IGZO) layer 310 does not form a layer of material on the surface of the amorphous indium gallium zinc oxide (IGZO) layer 310. The treatment process may include diffusing silicon ions into the amorphous indium gallium zinc oxide (IGZO) layer 310. In one embodiment, the amorphous indium gallium zinc oxide (IGZO) layer 310 may be exposed to a silicon containing gas such as silane or disilane containing gas. In another embodiment, the amorphous indium gallium zinc oxide (IGZO) layer 310 may be exposed to a plasma including or forming silicon ions. The silicon ion containing plasma may be formed remotely or in situ. The silicon ion containing plasma may be formed by flowing a silicon containing gas, such as silane or disilane or any suitable silicon containing gas, into a remote plasma source or a process chamber in which the amorphous indium gallium zinc oxide (IGZO) layer 310 is disposed. The silicon ion containing gas is then excited by an RF power and a silicon ion containing plasma is formed outside of the process chamber (i.e., remotely) or inside of the process chamber (i.e., in situ). In some embodiments, the silicon ion containing plasma may be oxygen free.

In some embodiments, the treatment time of the amorphous indium gallium zinc oxide (IGZO) layer 310 by the silicon ion containing gas or plasma 308, e.g., the time the amorphous indium gallium zinc oxide (IGZO) layer 310 is exposed to the silicon ion containing gas or silicon ion containing plasma, may range from about 10 seconds (s) to about 100 s, such as from about 20 s to about 60 s. The treating of the amorphous indium gallium zinc oxide (IGZO) layer 310 may be performed in the chamber in which the amorphous indium gallium zinc oxide (IGZO) layer 310 is deposited, such as the PVD chamber 100 shown in FIG. 1. Alternatively, the treating of the amorphous indium gallium zinc oxide (IGZO) layer 310 may be performed in a chamber in which subsequent layer is deposited, such as implantation chamber 200 shown in FIG. 2. In some embodiment, the amorphous indium gallium zinc oxide (IGZO) layer 310 is contacted with argon (Ar) gas having a flow rate ranging from about 2000 sccm to about 6000 sccm. In one embodiment, a remote plasma source may have a power density ranging from about 0.2 W/cm$^2$ to about 0.6 W/cm$^2$, such as about 0.4 W/cm$^2$. In embodiments, the pressure inside the implantation chamber may range from about 200 mTorr to about 900 mTorr, such as from about 500 mTorr to about 600 mTorr. The substrate on which the amorphous indium gallium zinc oxide (IGZO) layer 310 is disposed may be at about temperature ranging from about 20 to 30 degrees Celsius, or 20 to 325 degrees Celsius, or about 300 degrees Celsius. In some embodiments, contacting the amorphous indium gallium zinc oxide layer with silicon ions is performed at a temperature of 20-30, 20 to 25 degrees Celsius, 20 to 325 degrees Celsius in an atmosphere comprising 10% to 80% oxygen or, alternatively at about 300 degrees Celsius, or 20 to 325 degrees Celsius in an atmosphere devoid of oxygen.

Figure 3E:
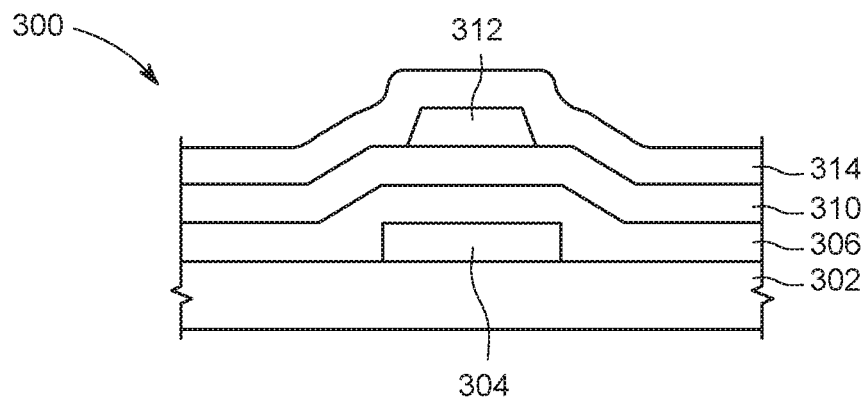

In some embodiments, as shown in FIG. 3E, after implantation an etch stop layer 312 may be deposited on the silicon ion treated metal oxide layer (IGZO layer such as silicon ion treated amorphous indium gallium oxide layer 310), and the etch stop layer 312 may be patterned to cover a portion of the treated amorphous indium gallium zinc oxide such as amorphous indium gallium zinc oxide (IGZO) layer 310. The etch stop layer 312 may be made of a dielectric material, such as silicon oxide, aluminum oxide, silicon nitride, or other suitable material. The etch stop layer 312 may be deposited in a PVD chamber, such as the PVD chamber 100 shown in FIG. 1. In some embodiments, a conductive layer 314 may be deposited on the etch stop layer 312 and the treated amorphous indium gallium zinc oxide (IGZO) layer 310, as shown in FIG. 3E. The conductive layer 314 may be made of an electrically conductive metal such as aluminum, tungsten, molybdenum, chromium, tantalum, and combinations thereof. The conductive layer 314 may be deposited by PVD.

Figure 3F:
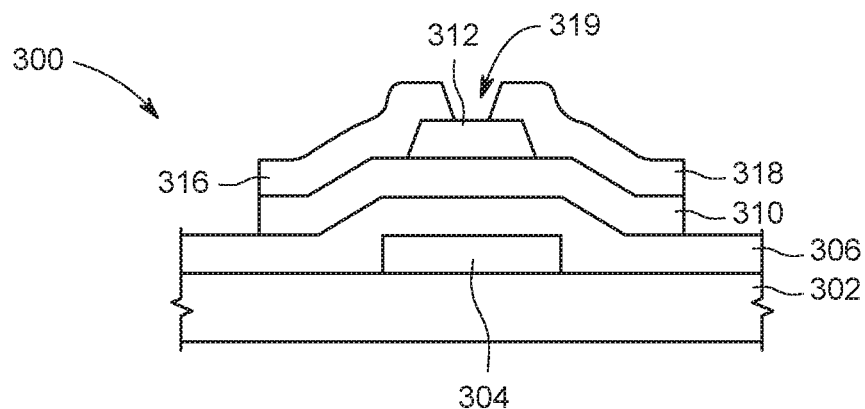

In some embodiments, after the conductive layer 314 is deposited, the source electrode 316, the drain electrode 318, and the active channel 319 may be defined by etching away portions of the conductive layer 314, as shown in FIG. 3F. Portions of the silicon ion treated amorphous indium gallium zinc oxide (IGZO) layer 310 may also be removed by etching, exposing portions of the gate dielectric layer 306. In some embodiments, the etch stop layer 312 functions to protect the active channel 319 from undue plasma exposure during etching.

Figure 3G:
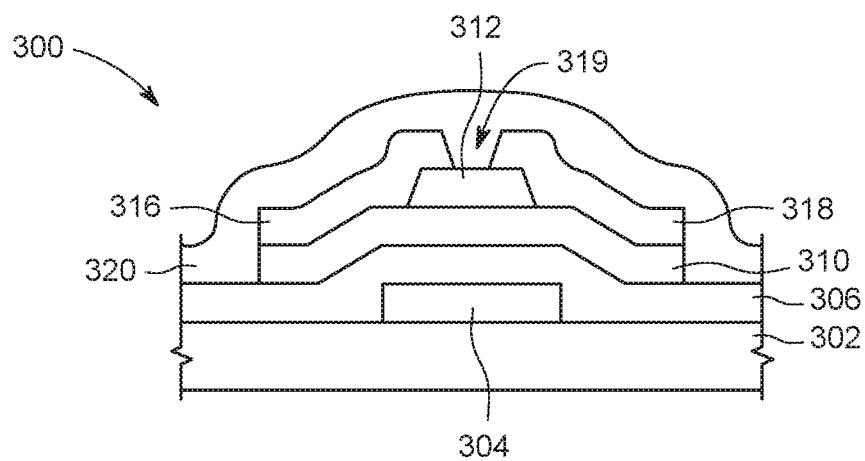

In some embodiments, as shown in FIG. 3G, a passivation layer 320 is deposited on the exposed portions of the gate dielectric layer 306 and the source electrode 316, the drain electrode 318, and the passivation layer 320 is also deposited in the active channel 319. The passivation layer 320 may include silicon oxide, silicon oxynitride, silicon carbide, amorphous carbon, or any other suitable material. The TFT 300 may be a bottom gate TFT. The silicon ion containing gas or plasma treatment may be performed on an amorphous indium gallium zinc oxide layer in any suitable TFT. In some embodiments, the silicon ion containing gas or plasma treatment is performed on an amorphous indium gallium zinc oxide of a top gate TFT.

Figure 4A:
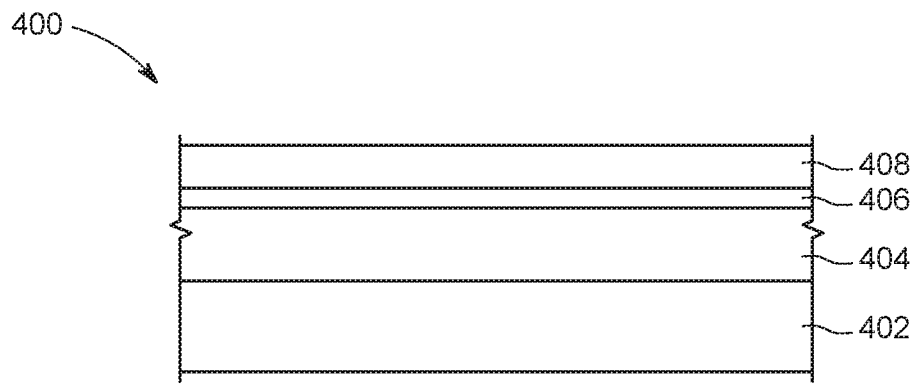
FIGS. 4A-4F are cross sectional schematic views of a TFT at various stages of fabrication according to embodiments of the present disclosure.
Figure 4B:
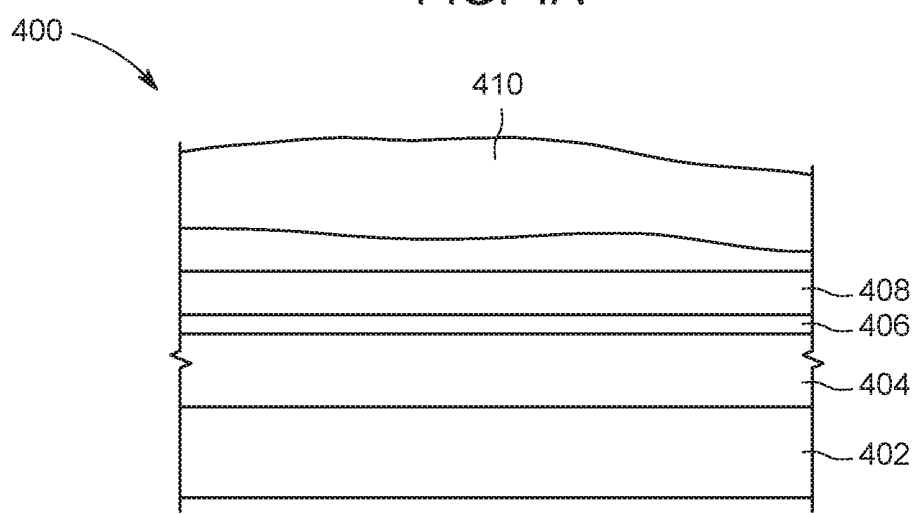

FIGS. 4A-4F are cross sectional schematic views of a TFT 400 at various stages of fabrication according to embodiments disclosed herein. The TFT 400 may be a top gate TFT and may include a substrate 402. The substrate 402 may be made of the same material as the substrate 302. A thermal oxide layer 404 may be formed on the substrate 402, and the thermal oxide layer 404 may be in direct contact with the substrate 402. A silicon oxide layer 406 may be formed on the thermal oxide layer 404, and the silicon oxide layer 406 may be in direct contact with the thermal oxide layer 404. An amorphous indium gallium zinc oxide layer 408 may be deposited over the substrate 402, such as on and in direct contact with the silicon oxide layer 406. The amorphous indium gallium zinc oxide layer 408 may be the active channel in the final TFT structure. The amorphous indium gallium zinc oxide layer 408 may be made of the same material as the amorphous indium gallium zinc oxide (IGZO) layer 310 and may be deposited by the same process used to deposit the amorphous indium gallium zinc oxide (IGZO) layer 310. After the amorphous indium gallium zinc oxide layer 408 is deposited, in order to prevent oxygen from leaving the amorphous indium gallium zinc oxide layer 408, the amorphous indium gallium zinc oxide layer 408 may be treated by a silicon ion containing gas or plasma. The silicon ion gas or plasma treatment of the amorphous indium gallium zinc oxide layer 408 may be the same as silicon ion gas or plasma treatment of the amorphous indium gallium zinc oxide (IGZO) layer 310, such as exposing the amorphous indium gallium zinc oxide layer 408 to a silicon ion containing gas or plasma 410, as shown in FIG. 4B. The silicon ion containing gas or plasma 410 may be the same as the silicon ion containing gas or plasma 308 shown in FIG. 3D.

Figure 4C:
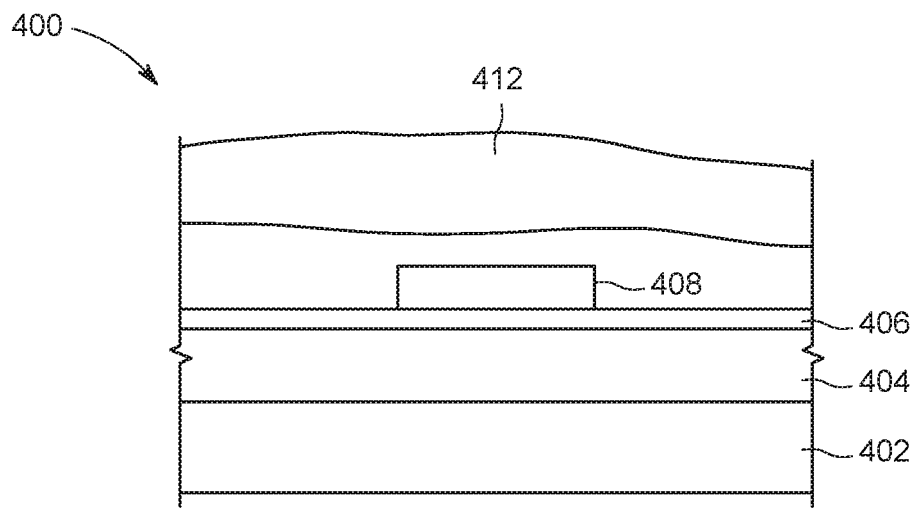

In some embodiments, as show in FIG. 4C, the silicon ion treated amorphous indium gallium zinc oxide layer such as amorphous indium gallium zinc oxide layer 408 may be patterned, such as by etching to remove portions of the amorphous indium gallium zinc oxide layer 408, to expose portions of the silicon oxide layer 406. Following the etching of the portions of the amorphous indium gallium zinc oxide layer 408, the amorphous indium gallium zinc oxide layer 408 may be treated again by a silicon ion containing gas or plasma 412. The silicon ion containing gas or plasma 412 may be the same as the silicon ion containing gas or plasma 308 shown in FIG. 3D. The treatment process conditions of the amorphous indium gallium zinc oxide layer 408 may be the same as the treatment process conditions of the amorphous indium gallium zinc oxide (IGZO) layer 310.

Figure 4D:
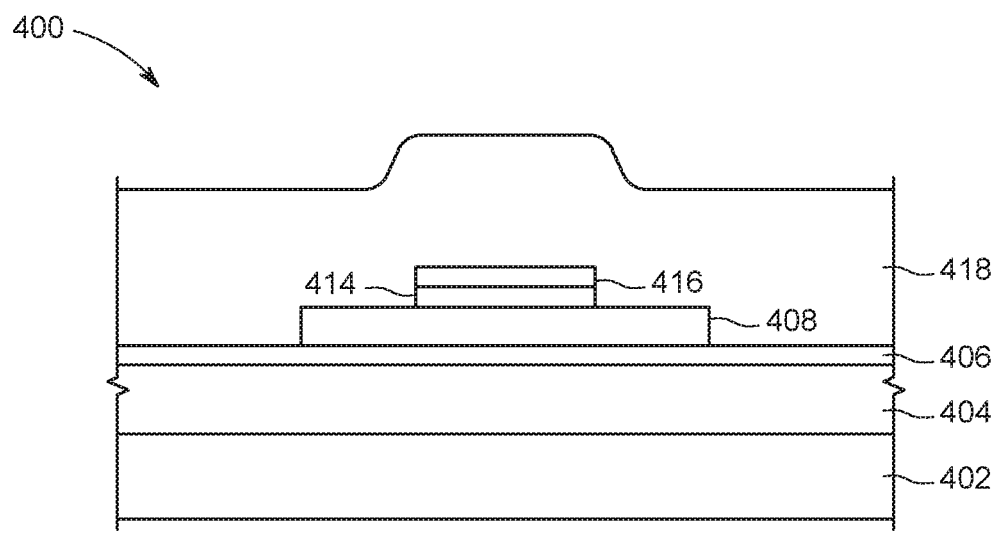

In some embodiments, as shown in FIG. 4D, a gate dielectric layer 414 may be deposited on the treated amorphous indium gallium zinc oxide layer 408. The gate dielectric layer 414 may be made of the same material as the gate dielectric layer 306. A gate contact layer 416 may be deposited on the gate dielectric layer 414, and the gate contact layer 416 may be made of the same material as the gate electrode 304. The gate dielectric layer 414 and the gate contact layer 416 may be patterned, such as by etching to remove portions of the gate dielectric layer 414 and the gate contact layer 416, to expose portions of the amorphous indium gallium zinc oxide layer 408. An inter-layer dielectric (ILD) layer 418 may be deposited on the exposed silicon oxide layer 406, the exposed amorphous indium gallium zinc oxide layer 408, and the gate contact layer 416. The ILD layer 418 may be made of any suitable dielectric material, such as silicon oxide.

Figure 4E:
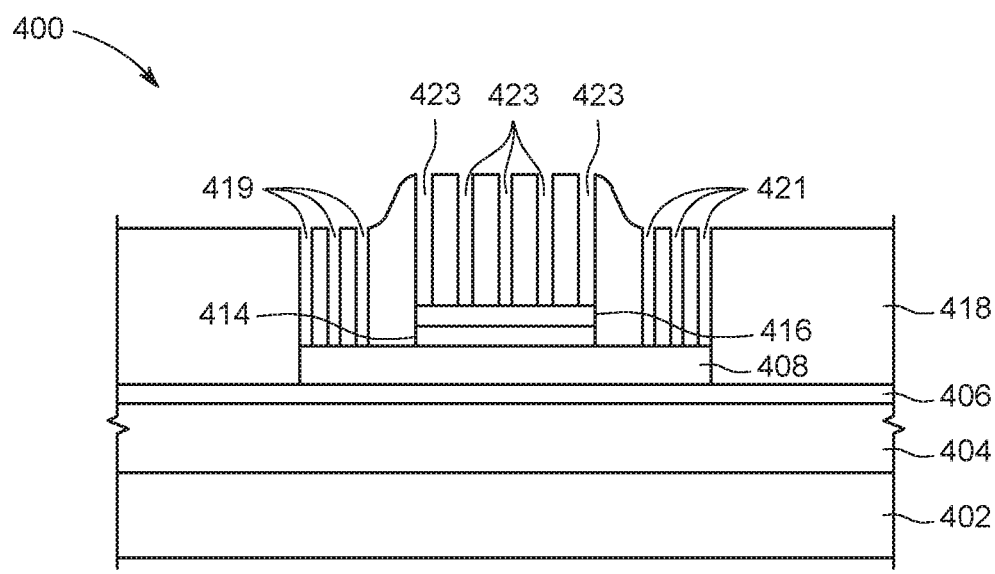
Figure 4F:
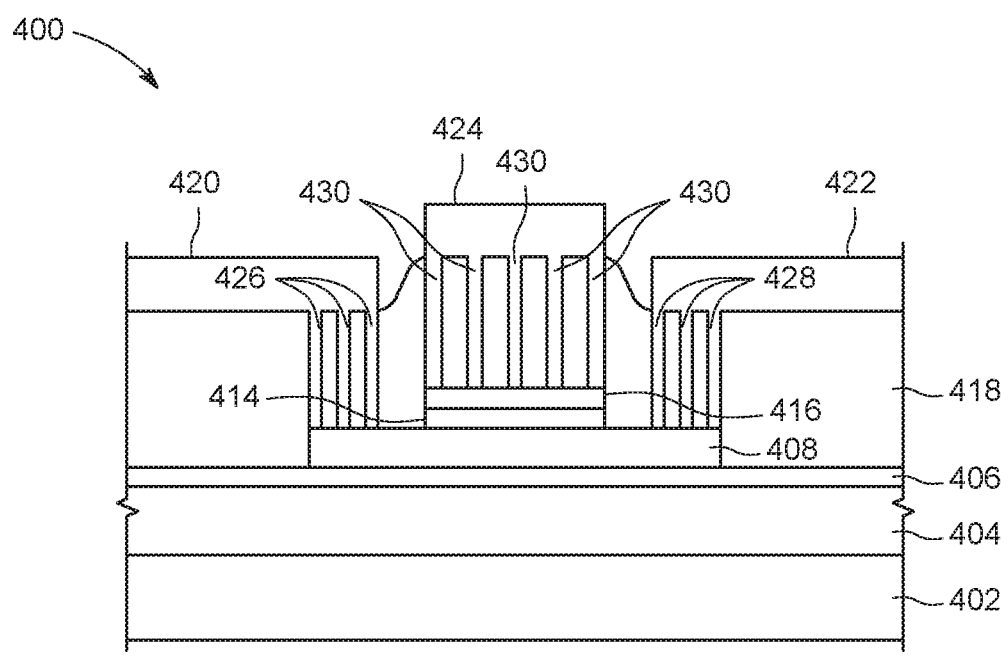

In some embodiments, a plurality of contact holes 419, 421, 423 may be formed in the ILD layer 418, as shown in FIG. 4E. The contact holes 419, 421, 423 may be formed by any suitable method, such as etching. Portions of the amorphous indium gallium zinc oxide layer 408 may be exposed due to the forming of the plurality of contact holes 419, 421, and portions of the gate contact layer 416 may be exposed due to the forming of the plurality of contact holes 423. The contact holes 419, 421, 423 may be filled with a metal to form contacts 426, 428, 430, respectively, as shown in FIG. 4E. The plurality of contacts 426, 428, 430 may be made of the same material as the gate electrode 304. The plurality of contacts 426, 428 may be in direct contact with the amorphous indium gallium zinc oxide layer 408, and the plurality of contacts 430 may be in direct contact with the gate contact layer 416. Referring to FIG. 4F, a metal layer may be deposited on the ILD layer 418, and the metal layer may be patterned to define a source electrode 420, a drain electrode 422, and a gate electrode 424. The source electrode 420, the drain electrode 422, and the gate electrode 424 may be made of the same material as the gate electrode 304. The source electrode 420 may be in direct contact with the plurality of contacts 426, the drain electrode 422 may be in direct contact with the plurality of contacts 428, and the gate electrode 424 may be in direct contact with the plurality of contacts 430. Since the gate electrode 424 is formed over the amorphous indium gallium zinc oxide layer 408, the TFT 400 may be a top gate TFT.

Figure 5:
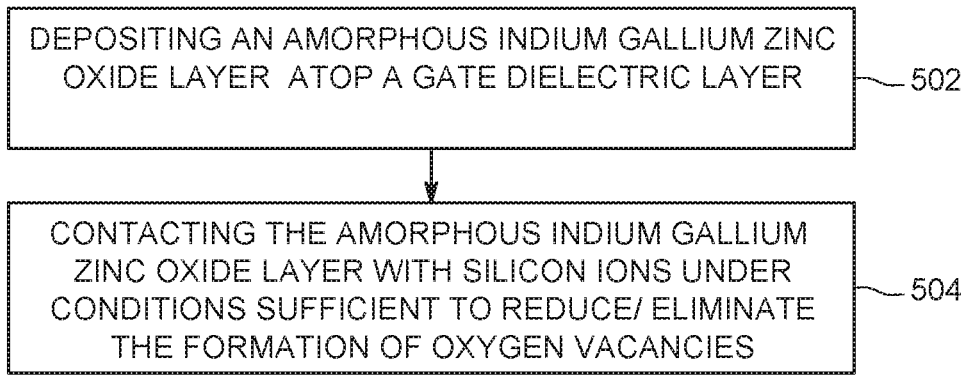
FIG. 5 is a flow chart showing a process for passivating oxygen vacancy of amorphous indium gallium zinc oxide in accordance with the present disclosure.

Referring now to FIG. 5, a flow chart showing one process for passivating oxygen vacancy formation within amorphous indium gallium zinc oxide in accordance with the present disclosure. In embodiments, the process is useful for forming the TFT 300 shown in FIGS. 3A-3G according to embodiments disclosed herein. As shown in FIG. 5, a process 500 starts with block 502, which is to deposit an amorphous indium gallium zinc oxide layer atop a gate dielectric layer. In some embodiments, the gate electrode may be the gate electrode 304 and the substrate may be the substrate 302 shown in FIG. 3A. Next, at block 504, the amorphous indium gallium zinc oxide layer is contacted with silicon ions under conditions sufficient to reduce or eliminate the formation of oxygen vacancies. For example, the amorphous indium gallium zinc oxide layer is exposed to a plurality of silicon ions from a silicon ion containing gas or plasma, under conditions and in an amount sufficient to implant silicon ions into the amorphous indium gallium zinc oxide layer to a predetermined depth and predetermined concentration.

In some embodiments the present disclosure relates to a method of passivating oxygen vacancy formation within amorphous indium gallium zinc oxide, including: depositing an amorphous indium gallium zinc oxide layer atop a gate dielectric layer; and contacting the amorphous indium gallium zinc oxide layer with silicon ions under conditions sufficient to reduce or eliminate the formation of oxygen vacancies. In some embodiments, silicon ions such as $Si^{4+}$ are generated in a remote plasma. In some embodiments, the silicon ions are generated in a first plasma ignited within an implantation chamber in which the amorphous indium gallium zinc oxide layer is disposed. In some embodiments, depositing the amorphous indium gallium zinc oxide layer atop a gate dielectric layer is performed in a physical vapor deposition chamber. In some embodiments, contacting the amorphous indium gallium zinc oxide layer with silicon ions is performed in an implantation chamber. In some embodiments, contacting the amorphous indium gallium zinc oxide layer with silicon ions is performed at a temperature of 20-30 degrees Celsius. In some embodiments, contacting the amorphous indium gallium zinc oxide layer with silicon ions is performed at a temperature of 20-325 degrees Celsius. In some embodiments, contacting the amorphous indium gallium zinc oxide layer with silicon ions at a dose of $7\times10^{15}/cm^2$ to $9\times10^{15}/cm^2$. In some embodiments, the amorphous indium gallium zinc oxide layer has a thickness of between about 10 to about 30 nanometers. In some embodiments, contacting the amorphous indium gallium zinc oxide layer with silicon ions is performed at a temperature of 20-25 degrees Celsius, or 20 to 325 degrees Celsius in an atmosphere comprising 10% to 80% oxygen or 20 to 325 degrees Celsius such as about 300 degrees Celsius in an atmosphere devoid of oxygen. In some embodiments, the amorphous indium gallium zinc oxide layer has a top surface and a bottom surface, a thickness of between about 10 to about 25 nanometers, wherein silicon ions are implanted adjacent the top surface to a depth of about 1 to 5 nanometers. In some embodiments, the wherein silicon ions are implanted to a predetermined depth, such as about 10% of the depth of the amorphous indium gallium zinc oxide layer from the top layer, such as about 20% of the depth of the amorphous indium gallium zinc oxide layer from the top layer, such as about 30% of the depth of the amorphous indium gallium zinc oxide layer from the top layer.

Figure 6:
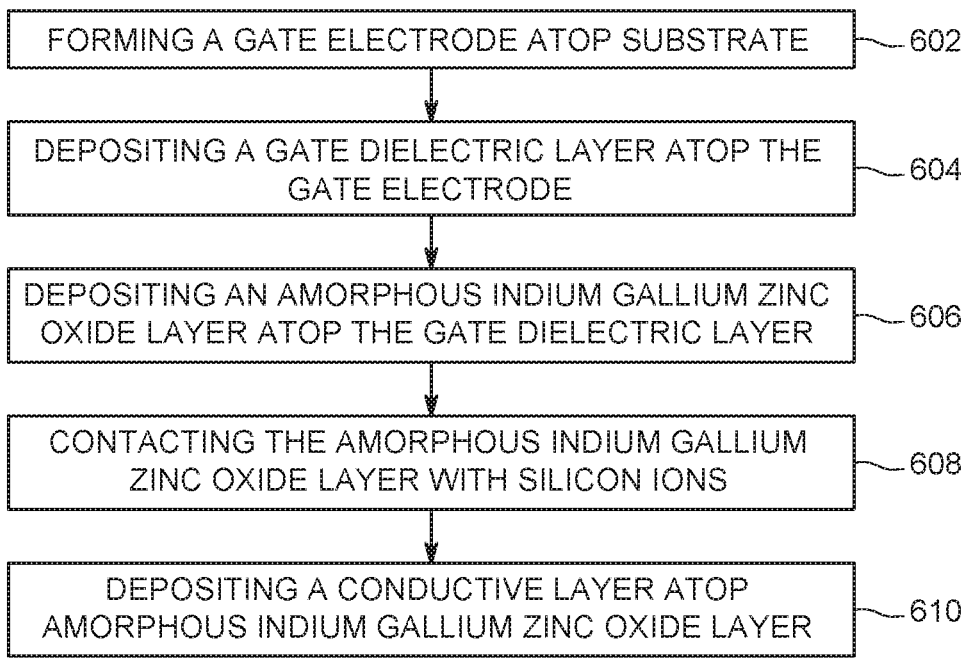
FIG. 6 is a flow chart showing a process for passivating oxygen vacancy of amorphous indium gallium zinc oxide in accordance with the present disclosure.

Referring now to FIG. 6, a flow chart showing one process for passivating oxygen vacancy formation within amorphous indium gallium zinc oxide in accordance with the present disclosure is shown. Process 600 starts with block 602 which is to deposit a gate electrode over a substrate. The gate electrode may be the gate electrode 304 and the substrate may be the substrate 302 shown in FIG. 3A. Next, at block 604, a gate dielectric layer is deposited over the gate electrode. The gate dielectric layer may be the gate dielectric layer 306 shown in FIG. 3B. An amorphous metal oxide layer, such as the amorphous indium gallium zinc oxide (IGZO) layer 310 shown in FIG. 3C, may be deposited over the gate dielectric layer, as shown at block 606. Following the deposition of the amorphous indium gallium zinc oxide layer, as shown at block 608, the amorphous indium gallium zinc oxide layer may be contacted with or exposed to one or more silicon ions. Next, the treated amorphous indium gallium zinc oxide layer may be subjected to additional downstream processing such as deposing a conductive layer atop or directedly atop the amorphous indium gallium zinc oxide layer, as shown at block 610.

In embodiments, the present disclosure relates to a method of passivating oxygen vacancy formation within amorphous indium gallium zinc oxide, including: forming a gate electrode atop a substrate; depositing a gate dielectric layer atop the gate electrode; depositing an amorphous indium gallium zinc oxide layer atop the gate dielectric layer; contacting the amorphous indium gallium zinc oxide layer with silicon ions; and depositing a conductive layer atop the amorphous indium gallium zinc oxide layer. In some embodiments, silicon ions are generated in a remote plasma. In some embodiments, the silicon ions are generated in a first plasma ignited within an implantation chamber in which the amorphous indium gallium zinc oxide layer is disposed. In some embodiments, depositing the amorphous indium gallium zinc oxide layer atop the gate dielectric layer is performed in a physical vapor deposition chamber. In some embodiments, contacting the amorphous indium gallium zinc oxide layer with silicon radicals is performed in an implantation chamber. In some embodiments, contacting the amorphous indium gallium zinc oxide layer with silicon ions is performed at a temperature of 20-30 degrees Celsius or 20 to 325 degrees Celsius. In some embodiments, contacting the amorphous indium gallium zinc oxide layer with silicon ions at a dose of about $8\times10^{15}$ ions/cm$^2$. In some embodiments, contacting the amorphous indium gallium zinc oxide layer with silicon ions at an energy of about 1 KeV. In some embodiments, the amorphous indium gallium zinc oxide layer has a thickness of between about 10 to about 30 nanometers. In some embodiments, the amorphous indium gallium zinc oxide layer has a top surface and a bottom surface, a thickness of between about 10 to about 25 nanometers, wherein silicon ions are implanted adjacent the top surface to a depth of about 1 to 5 nanometers.

In some embodiments, the present disclosure relates to a thin film transistor including: an amorphous indium gallium zinc oxide layer atop a gate dielectric layer, wherein the amorphous indium gallium zinc oxide layer has a top portion, and bottom portion, wherein silicon ions are implanted within the top portion. In some embodiments the implantation penetrates only the top portion which may be 40%, 30%, 25%, 20%, or 15% of the amorphous IGZO material. In some embodiments the implantation penetrates the top portion which is about 1 to 30 percent of the total thickness of the amorphous IGZO material. In some embodiments, the implantation penetrates the top portion which is 33% of the altered amorphous IGZO material measured from the top surface 311 of the IGZO material.

In some embodiments, the present disclosure relates to a non-transitory computer readable medium having instructions stored thereon that, when executed, cause a method for passivating oxygen vacancy formation within amorphous indium gallium zinc oxide, including: depositing an amorphous indium gallium zinc oxide layer atop a gate dielectric layer; and contacting the amorphous indium gallium zinc oxide layer with silicon ions under conditions sufficient to reduce or eliminate the formation of oxygen vacancies.

While the foregoing is directed to embodiments of the present disclosure, other and further embodiments of the disclosure may be devised without departing from the basic scope thereof.

The invention claimed is:

1. A method of passivating oxygen vacancy formation within amorphous indium gallium zinc oxide, comprising:
   depositing an amorphous indium gallium zinc oxide layer atop a gate dielectric layer; and
   contacting the amorphous indium gallium zinc oxide layer with silicon ions under conditions sufficient to reduce or eliminate a formation of oxygen vacancies,
wherein the amorphous indium gallium zinc oxide layer has a top surface and a bottom surface, a thickness of between about 10 to about 25 nanometers, wherein the silicon ions are implanted adjacent the top surface to a depth of about 1 to 5 nanometers.

2. The method of claim 1, wherein the silicon ions are generated in a remote plasma.

3. The method of claim 1, wherein the silicon ions are generated in a first plasma ignited within an implantation chamber in which the amorphous indium gallium zinc oxide layer is disposed.

4. The method of claim 1, wherein depositing the amorphous indium gallium zinc oxide layer atop the gate dielectric layer is performed in a physical vapor deposition chamber.

5. The method of claim 1, wherein contacting the amorphous indium gallium zinc oxide layer with silicon ions is performed in an implantation chamber.

6. The method of claim 1, wherein contacting the amorphous indium gallium zinc oxide layer with silicon ions is performed at a temperature of 20-325 degrees Celsius in an atmosphere comprising 10% to 80% oxygen or at about 20-325 degrees Celsius in an atmosphere devoid of oxygen.

7. The method of claim 1, wherein contacting the amorphous indium gallium zinc oxide layer with silicon ions is at a dose of $7\times10^{15}$/cm$^2$ to $9\times10^{15}$/cm$^2$.

8. The method of claim 1, wherein the amorphous indium gallium zinc oxide layer has a thickness of between about 10 to about 30 nanometers.

9. A method of passivating oxygen vacancy formation within amorphous indium gallium zinc oxide, comprising:
   forming a gate electrode atop a substrate;
   depositing a gate dielectric layer atop the gate electrode;
   depositing an amorphous indium gallium zinc oxide layer atop the gate dielectric layer;
   contacting the amorphous indium gallium zinc oxide layer with silicon ions;

subsequently depositing and patterning an etch stop layer atop a central portion of the amorphous indium gallium zinc oxide layer; and depositing a conductive layer atop the etch stop layer and the amorphous indium gallium zinc oxide layer.

10. The method of claim 9, wherein the silicon ions are generated in a remote plasma.

11. The method of claim 9, wherein the silicon ions are generated in a first plasma ignited within an implantation chamber in which the amorphous indium gallium zinc oxide layer is disposed.

12. The method of claim 9, wherein depositing the amorphous indium gallium zinc oxide layer atop the gate dielectric layer is performed in a physical vapor deposition chamber.

13. The method of claim 9, wherein contacting the amorphous indium gallium zinc oxide layer with silicon ions is performed in an implantation chamber.

14. The method of claim 9, wherein contacting the amorphous indium gallium zinc oxide layer with silicon ions is performed at a temperature of 20-325 degrees Celsius.

15. The method of claim 9, wherein contacting the amorphous indium gallium zinc oxide layer with silicon ions is at a dose of about $8\times10^{15}$ ions/cm$^2$.

16. The method of claim 9, wherein contacting the amorphous indium gallium zinc oxide layer with silicon ions is at an energy of about 1 KeV.

17. The method of claim 9, wherein the amorphous indium gallium zinc oxide layer has a thickness of between about 10 to about 30 nanometers.

18. The method of claim 9, wherein the amorphous indium gallium zinc oxide layer has a top surface and a bottom surface, a thickness of between 10 to 25 nanometers, wherein the silicon ions are implanted adjacent the top surface to a depth of about 1 to 5 nanometers.

* * * * *